(12) United States Patent
Parker et al.

(10) Patent No.: US 6,330,708 B1
(45) Date of Patent: Dec. 11, 2001

(54) METHOD FOR PREPARING COMMAND FILES FOR PHOTOMASK PRODUCTION

(75) Inventors: Thomas R. Parker, Burlington, VT (US); Stephen B. Houchen, Charlotte, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/156,788

(22) Filed: Sep. 17, 1998

(51) Int. Cl.[7] .............................. G06F 17/10; G06F 7/60
(52) U.S. Cl. .................................. 716/19; 716/21
(58) Field of Search ................................. 716/19

(56) References Cited

U.S. PATENT DOCUMENTS

| | | | | |
|---|---|---|---|---|
| 4,698,509 | * | 10/1987 | Wells et al. ..................... | 250/494.2 |
| 4,970,387 | * | 11/1990 | Kubo et al. ..................... | 250/231.14 |
| 4,979,223 | * | 12/1990 | Manns et al. .................... | 382/8 |
| 5,018,210 | * | 5/1991 | Merryman et al. ................ | 382/8 |
| 5,159,201 | * | 10/1992 | Frei ............................. | 250/492.2 |
| 5,251,140 | * | 10/1993 | Chung et al. .................... | 364/474.02 |
| 5,294,800 | * | 3/1994 | Chung et al. .................... | 250/492.22 |
| 5,340,700 | | 8/1994 | Chen et al. ..................... | 430/312 |
| 5,448,494 | * | 9/1995 | Kobayashi et al. ............... | 364/489 |
| 5,450,332 | * | 9/1995 | Criscuoli et al. ................ | 364/490 |
| 5,537,580 | | 7/1996 | Giomi et al. .................... | 395/500 |
| 5,571,639 | * | 11/1996 | Hubbell et al. .................. | 430/5 |
| 5,593,839 | * | 1/1997 | Hubbell et al. .................. | 435/6 |
| 5,608,638 | * | 3/1997 | Tain et al. ..................... | 364/468.28 |
| 5,631,110 | * | 5/1997 | Shioiri et al. .................. | 430/5 |
| 5,666,288 | | 9/1997 | Jones et al. .................... | 364/490 |
| 5,784,292 | * | 7/1998 | Kumar ........................... | 716/19 |
| 5,844,810 | * | 12/1998 | Douglas et al. .................. | 364/491 |
| 5,900,941 | * | 5/1999 | Matsuyama et al. ................ | 356/394 |
| 6,056,785 | * | 5/2000 | Chisaka ......................... | 716/19 |
| 6,225,025 | * | 5/2001 | Hoshino ......................... | 430/296 |

OTHER PUBLICATIONS

R. Chiang et al., From CIF to Chips, Proceedings of Eighth Biennial University/Government/Industry Symposium, pp. 156–159, Jun. 1989.*

* cited by examiner

*Primary Examiner*—Matthew Smith
*Assistant Examiner*—A. M. Thompson
(74) *Attorney, Agent, or Firm*—Connolly Bove Lodge & Hutz

(57) ABSTRACT

Method for producing CATS include files for photomask production. A table of algorithms identifies each level of the design to be used in a given photomask layer. A key word table is created to identify special functions that must be performed on the data to define changes to be made to polygons in the pattern data of the mask. Compensations for dimensions of the polygons are applied to one or more data levels of the design data based on the specific process and vendor tools to be used to make the photomask. Optimal mathematical steps are derived from the algorithms and include any respective dimensional compensations which are needed to create the polygons of the mask. Each of the mathematical steps are broken into one or more substeps which are executed to create the pattern data. The executable substeps enhance parallel computation for creating the pattern data.

12 Claims, 2 Drawing Sheets

METHOD FOR PREPARING COMMAND FILES FOR PHOTOMASK PRODUCTION

BACKGROUND OF THE INVENTION

The present invention relates to processes for creating photomasks which are used in integrated circuit manufacture. Specifically, a process is described for creating a photomask exposure data file for defining objects on a photomask.

The process of manufacturing integrated circuit masks which are used in photolithographic techniques to define semiconductor structures on a substrate relies upon the generation of one or more pattern files that define the exposure areas of the photomask as well as a Job Deck or similar file, depending on the specific exposure tool that is used. The layout for the photomask is created from the pattern files, such as a Moving Electron Beam Exposure (MEBES) data file. The data is based on specific designer inputs which define functional logic and which are subsequently modified for particular semiconductor processes and vendor equipment. The design specification created by the circuit designer is used as an input for algorithms which define photomask structural details.

Using a conventional data conversion and manipulation (fracturing) software, such the Computer Aided Transcription System (CATS) from Transcription Enterprises, Ltd., the designer's input in the form of levels is subjected to an algorithm which defines the photomask structures. A series of CATS Include Files are created from the results of combining the algorithm with information about the input data, and these Include files are then passed to the CATS execution software which performs the operations and produces the pattern data. Various mask creating tools use this pattern data (which can vary based on the specific tool used) to create masks defining the particular regions to be created on a semiconductor substrate to obtain the designer's specified circuit functionality.

As the volume of data which is necessarily entered to create these Include files involves several people using several processes, errors are likely. Automating the process of creating the CATS Include Files reduces mask errors, correspondingly increasing yields and reducing processing time.

The present invention further automates the process of creating the CATS Include Files so that user inputs are held to a minimum, reducing the errors and subsequent inefficiency of mask production.

The algorithms which define the photomask structures can be more efficiently processed if the Include files are created (and controlled) to enhance parallel processing. The process of creating the Include Files is therefore advantageously structured to create numerous include files that can be executed in parallel, thus further improving the efficiency of mask production.

SUMMARY OF THE INVENTION

The present invention provides for a method of producing CATS Include Files which is automated to reduce errors in the photomask production. The CATS Include Files are constructed from build information received from the product engineer. The build information is used with the algorithms to determine functions that must be performed on the data to produce the polygons that will be put in the pattern data. This pattern data is then used to expose a photomask, which defines one layer of the intended circuit. A series of photomasks, based on the semiconductor process being used, each specify one layer of the entire circuit that will appear on the semiconductor wafer. The creation of the CATS Include files is accomplished on an automated basis, and creates command files which are most efficient for processing the given design data. The resulting Include files are passed to CATS where they are executed to produce the pattern data. This pattern data is then used by the mask exposure tool to make the photomask.

In accordance with the invention, the table of algorithms is created by the product engineer which identifies each level of the design to be used in any given photomask layer. This may be done independently for each piece of design data that will appear on a photomask, if multiple designs will be built on the same photomask. Each of these independent pieces of resulting pattern data can be referred to as a segment. In addition to the algorithm table, a key word table is created by the product engineer to identify any special functions that must be performed on the data which define changes to be made to the polygons in the pattern data. These changes are usually for the purpose of optimizing the yield of the photomask fabrication and/or the subsequent integrated circuit fabrication processes.

In creating the final data used to manufacture a mask, compensations for dimensions of the polygons are applied to one or more data levels of the design data, based on inputs from a table. This is based on the specific process and vendor tools to be used in the photomask and integrated circuit manufacture. Optimal mathematical steps are then derived from the algorithms and include any respective dimensional compensations which are needed. Each of these mathematical steps is then broken down into one or more CATS Include files, which can be executed to create the pattern data used in photomask production.

Each of the CATS Include files are set up in executable substeps designed to enhance parallel computation for creating the pattern data. A series of dependencies is developed as the Include files are derived which identifies which of the substeps depend on a previous substep's computation, thereby facilitating efficient parallel processing of the substeps. The resulting CATS Include files are integrated with other Include files that were generated to produce the inspection data for the photomask into a command file. This command file is then submitted to the Load Leveler software (produced by IBM) which executes CATS using the given Include files (in parallel where possible) to produce the output pattern and inspection data.

DESCRIPTION OF THE PREFERRED EMBODIMENT

Figure 1:
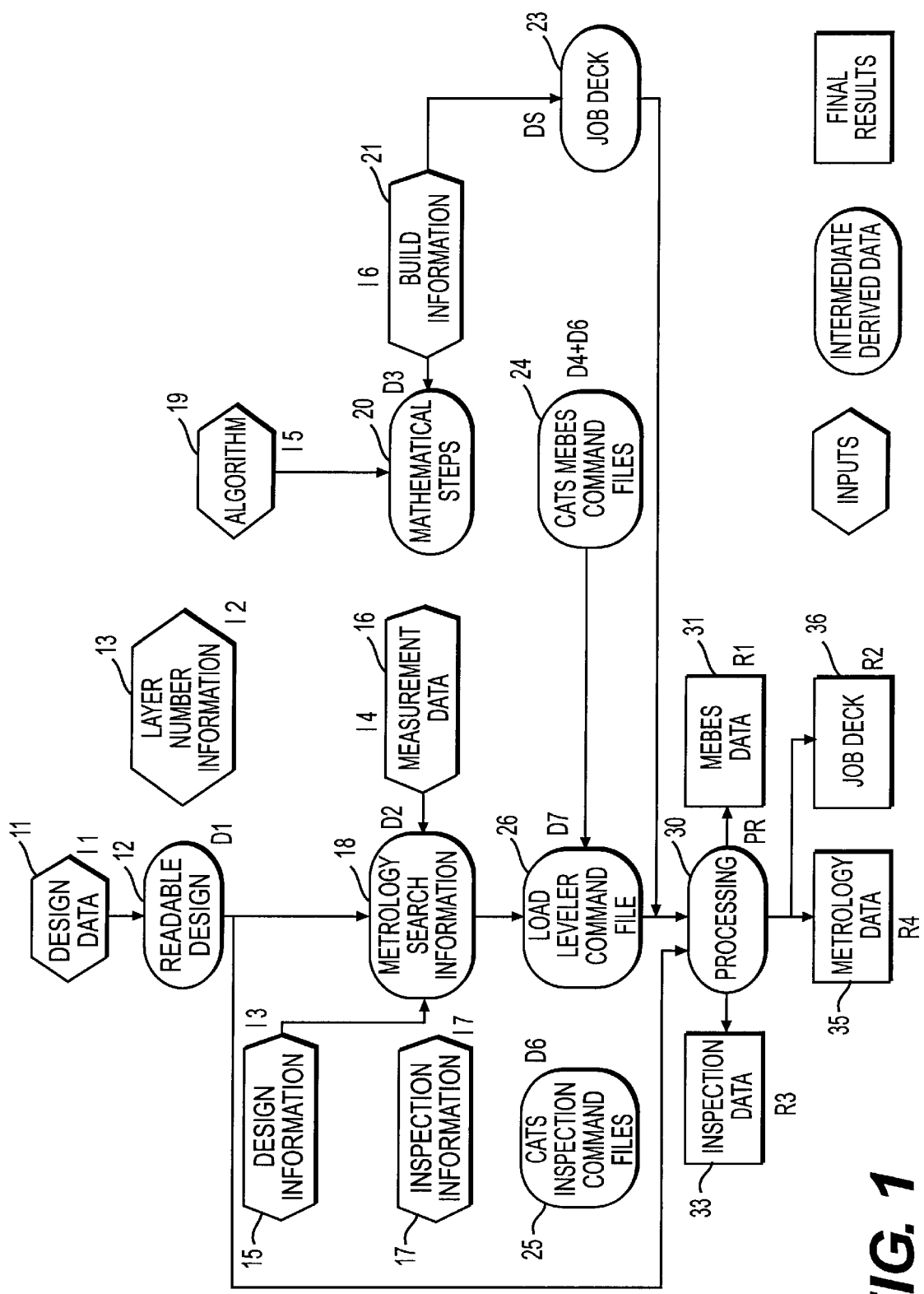
FIG. 1 is an illustration of the system for defining the required steps for creating the pattern (and inspection) data.

Referring now to FIG. 1, there is shown the overall process of creating data for creating a photomask using a mask exposure tool. The manufacture of the photomask begins with design data which is input to the system in 11, as well as a layer number information file (or translation file) which is provided as an input 13. This translation file may not be required for all types of design data. This layer number information permits the data level names input into the algorithm 19 and build information 21 to be in alphanumeric notation rather than numeric notation, as set forth in industry standard formats like GDS II, which results in readable (or interpretable) design data 12.

Certain shapes on masks are measured during manufacture to determine whether they meet the specifications set forth in the order. The critical dimensions and the tolerance of those dimensions is provided in a database as input 16. This is used to select a search pattern to be created on the photomask in 18. This search pattern is used to create one or more CATS Include files that will generate measurement file(s).

As an alternate method of generating a measurement file, the location of specific structures within the design data can be extracted. This can be done on a specific naming convention agreed upon before this system was laid out, or by providing a list of additional structures to include in input 15. (Input 15 is therefore completely optional, and is dependent on the design as to whether it is needed). The locations of these structures are identified, and a CATS Include file can be generated from those locations to allow a measurement file to be built.

Other inputs to the system include the algorithms 19, which define for each segment of the mask the relationship between design levels that are to be applied for a given photomask layer. The design levels created by the circuit designer define the typical binary circuit elements which make up the overall functionality of the integrated circuit chip. Further, the desired kerf is specified in 21. This Kerf contains scribe lines for dicing the wafer into individual chips. In addition, the kerf contains electrical test macros for testing the chip while it is still in production and registration/alignment information for the wafer exposure tools (steppers). This kerf is contained in a software table, which is consulted when the kerf is to be created for the photomask.

The algorithms for the product chip are supplied by the product engineer to set forth the required circuit elements to carry out the functionality. These algorithms are based on the technology (general semiconductor process) being used, and can be re-used for many pieces of design data that will use that same technology. This is another advantage of using the alphanumeric level names and having the translation file: Simply by having the designer map data levels to specific alphanumeric names by correctly defining the layer number file, we can reuse one given set of algorithms for many designs and many customer design conventions.

The algorithm 19 is combined with build information that provides specific technology parameters, i.e., which wafer stepper tools will be used, wafer line resist contrast, etc., provided in 21 for each photomask layer, to define the mathematical steps that must be performed on the design data to produce each piece of pattern data.

As will be explained in detail, the build information along with the algorithms are used to create the CATS Include files 24 to produce the MEBES data 31. The CATS Include files are instructions for manipulating the various polygon structures present in the design data to define the polygons that will appear on the photomask in a given segment.

The mask must also be inspected during manufacturing to make sure the polygons were correctly formed on the mask. This requires a dataset to be created for the given inspection tool. Which tool the given mask will be inspected on (or may be inspected on if there are multiple tools and there are load balancing issues) is input in 17. This is used along with a knowledge of the output names to create one or more CATS Include files that will generate the inspection data 25.

Based on the information stored with the Kerf in software tables (which is created as a byproduct of the kerf design) or from independent inputs in another table (both part of 21), a Job Deck 36 can be created that specifies the location of all of the segments on the mask. A barcode, alignment marks, quality assurance patterns, and other required marks are added to the Job Deck as necessary (as defined by other build information, such as the wafer stepper, etc.)

The CATS MEBES Include files 24 are integrated with the Inspection Include Files 25 and the Metrology Search Information (Include Files) 18 using known dependencies and the dependencies generated during interpretation of the algorithm within a command file 26. This command file will drive a software program from IBM, known as Load Leveler, which will control the dispatch of the steps of our job across all of our many servers, so that the various steps are assigned to idle processors to effectively execute the commands represented by the Include files.

This load leveler command file 26 is submitted to Load Leveler, and processing is performed 30 on all of the Include Files by CATS to generate the desired outputs; MEBES Data 31, A Job Deck 36, Inspection Data 33, and Metrology Data 35.

Figure 2:
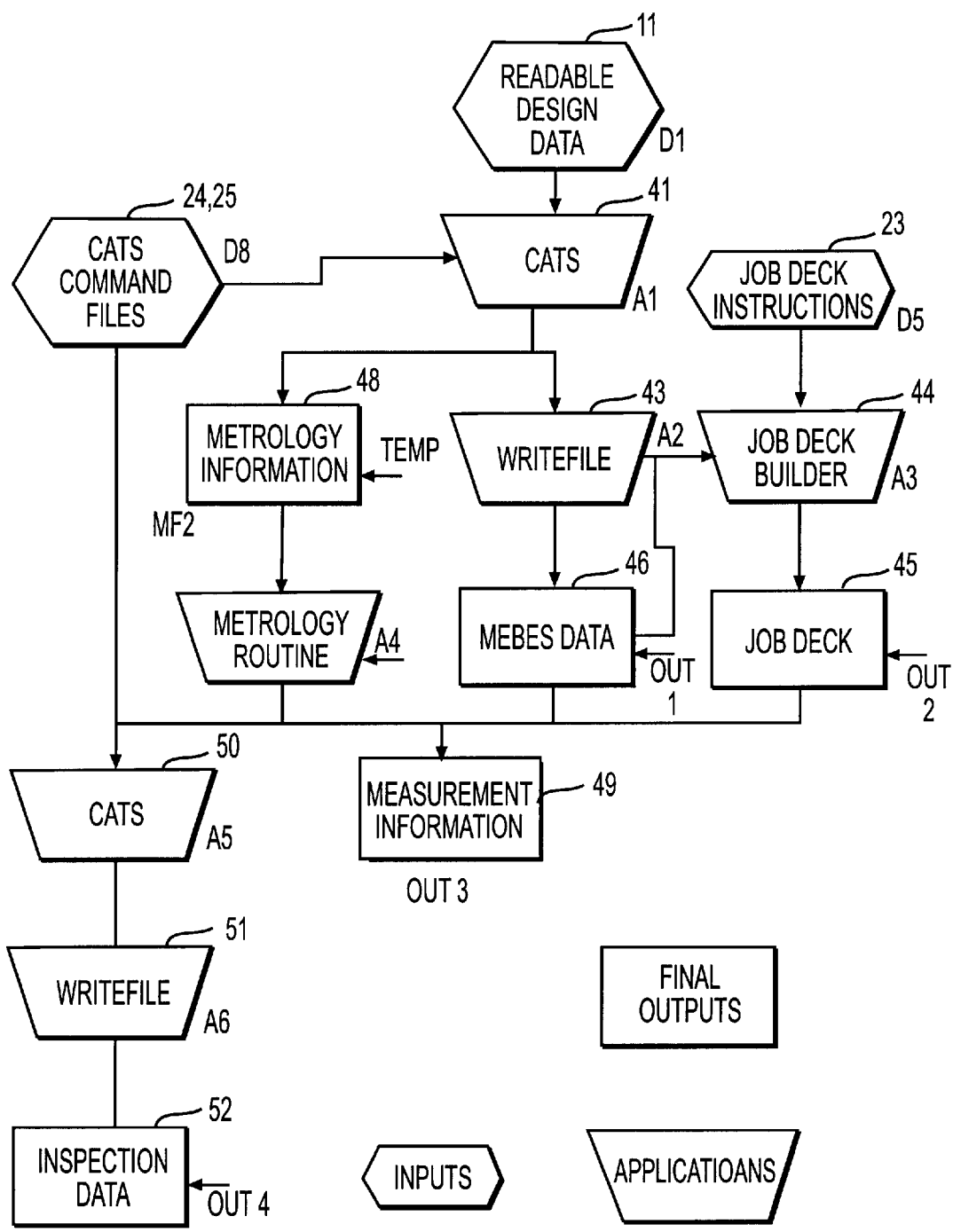
FIG. 2 illustrates an execution sequence for the process performed by Load Leveler.

FIG. 2 illustrates the processing 30 of FIG. 1 in greater detail. The readable design data 11 is received as input to CATS 41. CATS 41 executes instructions contained in the various Include files that were created in FIG. 1. The outputs from running the CATS Include files are not exactly in the format that is required by the various manufacturing tools, so a utility provided as part of the CATS suite of applications, called Writefile 51 is used to convert these multiple datasets into data that is ready for the mask exposure tool. The placement of these datasets on the photomask is defined by the Job Deck 23 as well as in accordance with the information contained within the data itself. The Job Deck Builder 44 uses the MEBES data and some limited information from 21 to identify the location and type of quality assurance patterns and other structures to be written to the mask. The combined data from the Writefile 43 and the job deck 45 contain all of the information for locating the polygon circuit structures on the photomask.

The metrology routine 48 takes the information from the metrology include files to create the file 49 that will be used to carry out various measurements on the photomask. The MEBES Data and Job Deck are used in other Include files generated in 25 to produce the Inspection Data 52.

Having described the overview of the method for preparing Include Files, the detailed description of a significant part of the preferred embodiment of the invention, which comprises a method for efficiently compiling the CATS MEBES command files will be described.

The algorithm provided by the product engineer describes the relationship between layers which form the polygons on the photomask. As one example, the following algorithm table 1 indicates for layers AB of a segment which includes the product chip, a segment for a related Kerf, and the algorithms which relate the layers to define the Kerf and the chip product.

TABLE 1

| Layer | Segment | Algorithm |
|---|---|---|
| AB | Product Chip | (<<AB>> + <<AC>> + AD) − ADE |
| AB | Kerf | ((<<AB>> + AD + ADY) − ADE) + % A |

Additionally, a key word table 2 is input by the product designer with the algorithm inputs 19. The key word table describes for each layer of each segment the algorithm piece and any special function associated with the algorithm piece, as well as an optional functional argument.

TABLE 2

| Layer | Segment | Algorithm Piece | Special Function | Optional Function Args |
|---|---|---|---|---|
| AB | Product Chip | <AB> | ASYM .5,1 | |
| AB | Product Chip | <<AB>> | ASYM .55,1.2 | |
| AB | Kerf | <AB> | ASYM .5,1 | |
| AB | Kerf | <<AB>> | ASYM .55,1.2 | |
| AB | Product Chip | <AC> | ASYM .4,.9 | 0,0.025 u |
| AB | Product Chip | <<AC>> | ASYM .55,1.2 | |

The special function ASYM defines the size of shape to be specially compensated for a given algorithm piece. The optional function arguments, as shown in the key word table for the algorithm piece AC of the AB layer for the product chip, relates to any special compensations that may have to be applied, which accounts for any nonlinearities in the mask etch process. The special function identifies all the polygons in the design data that are of the dimension associated with ASYM. For instance, ASYM 0.5, 1.0 indicates a special function of selection all the polygons in the data that are 0.5 microns by 1 micron. The asymmetric device compensations (ASYM) are extracted from a database, and may be overriden by a prompt to the user.

As an additional input by the Fabrication Facility Process Engineer, table 3 shows a product build information table which contains various compensation factors for each segment (product or Kerf). The product engineer identifies the layer, and the system retrieves the design grid and product scale, from database tables stored in the data processing system. The various compensations are added by the system for each data level in which the polygon structures of the photomask are compensated.

TABLE 3

| Data Level | Device Line Process Compensation (Product Chip) | Device Line Process Compensation (Kerf) |
|---|---|---|
| AB | .1 | .1 |
| AC | −.05 | — |
| AD | .075 | .075 |
| ADY | — | .075 |
| ADE | .05 | .05 |
| KERFAB | — | .05 |
| POSMKS | — | .05 |
| PROTECT | — | 0 |
| FRAME | — | .05 |

These compensations effectively resize the polygons for the Kerf or product chip. The calculated compensations also include data levels KERFAA, POSMKS, FRAME and PROTECT.

The algorithm for layer AB of the Kerf from table 1 indicates a contrast factor, % A, which is a macro known as "auto data level strategy" which adds to the algorithm the following levels:

For a positive mask: KERFXX (where XX is the level name), POSMKS, FRAME, PROTECT, For a negative mask: KERFXX (where XX is the level name), NEGMKS.

From the foregoing information, an algorithm may be derived for the Kerf or the product chip. The Kerf algorithm may be represented as:

((<<AB>>+AD+ADY)−ADE)+KERFAB+POSMKS+PROTECT+FRAME.

The various compensations are established from the build product information of Table 3 to yield the following modified algorithm:

(([<<AB>>+0.1]+[AD+0.075]+[ADY+0.075])−[ADE+0.05])+[KERFAB+0.05]+[POSMKS+0.05]+PROTECT+[FRAME+0.05]

The formulation of the algorithm which defines the shapes and sizes of the polygons on the photomask are then broken up into the mathematical steps 20 of FIG. 1. Using the most rudimentary approach, this algorithm can be reduced to four steps as follows:

1) <<AB>>
2) [STEP_1+0.1]+[AD+0.075]+[ADY+0.075]
3) STEP_2−[ADE+0.05]
4) STEP_3+[KERFAB+0.5]+[POSMKS+0.5]+PROTECT+[FRAME+0.05].

The notation around AB indicates two separate key words to be applied. <<AB>> is actually two key word calls, each represented by one set of greater-than/less-than brackets < >. They are written in the key word table as <AB> and <<AB>>.

Often, CATS can process the above mathematical steps only if they are broken into smaller substeps. Many additional substeps are created for the purposes of getting CATS to function more efficiently. Thus, the mathematical steps 20 combine the user input information including the algorithms 19, compensation, and special functions, taken from the above tables in a way which enhances the execution by the CATS system.

In rewriting the steps for compiling in the CATS MEBES command files 24, substeps are created which are advantageously run in parallel. However, dependencies must be observed in executing the CATS MEBES command files 24 because one substep may depend on a previous substep calculation. During execution of the substeps by the CATS system, the various ASYM functions are executed in accordance with the substeps. For instance, for the Kerf, level AB is determined to have a special function ASYM 0.5, 1.0 for selecting all the polygons in the data that are 0.5 microns by 1 micron. Thus, step 1 is rewritten using the key word table 2 special function as <AB:ASYM 0.5,1.0;−0.025,0.025> where −0.025,0.025 are special compensations for the ASYM. During execution by our system, the foregoing mathematical step is converted by the system into multiple CATS Include files. In the case of a single ASYM key word in a substep, there are up to eight CATS command files that are required.

The process of compiling CATS MEBES command files 24 to have an efficient execution by the CATS system 30 requires that each of the four steps be broken into substeps which have the capability of parallel execution. Further, a dependency tree must be created for the CATS MEBES command files to identify the substeps which require a specific order of execution, as a particular substep may depend on the result of another substep.

Each of the steps are operations which create and modify structures on the photomask which define the integrated circuit. The steps when executed change the dimensions of the structures to effect the various asymmetric compensations for polygons of each layer.

The present invention takes advantage of the fact that the substeps may be created so that efficient parallel execution of the substeps may be done to modify the polygon structures. In the foregoing example two ASYM functions were performed, for layer AB of the Kerf. The first involved ASYM 0.5,1 and the second ASYM 0.55,1.2. The polygons having the size defined by the ASYM keywords are compensated in long and short directions as follows:

TABLE 4

| Layer | Shape Size | Long Direction Comp | Short Direction Comp |
|---|---|---|---|
| AB | 0.5 × 1.0 | 0.025 | −0.025 |
| AB | 0.55 × 1.20 | 0.05 | −0.025 |

The substeps for effecting the compensations can be arranged so that polygons of differing size are compensated, and then the shapes of the remaining size are compensated. The compensated shapes of each size are then added together. The combined selected shapes of each size are removed. The compensated shapes of each group are added together and reentered into the data. This process is illustrated below as sixteen substeps:

SUBSTEP 1) Select Horizontally Oriented 0.5×1.0 Shapes (long in horizontal direction)

SUBSTEP 2) Select Vertically Oriented 0.5×1.0 Shapes

SUBSTEP 3) Combine Selected Shapes (SUBSTEP_1+SUBSTEP_2)

SUBSTEP 4) Compensate output of SUBSTEP_1 (SUBSTEP_1+0.025 in X, −0.025 in Y)

SUBSTEP 5) Compensate output of SUBSTEP_2 (SUBSTEP_2−0.025 in X,+0.025 in Y)

SUBSTEP 6) Select Horizontally Oriented 0.55×1.2 Shapes (long in horizontal direction)

SUBSTEP 7) Select Vertically Oriented 0.55×1.2 Shapes

SUBSTEP 8) Combine Selected Shapes (SUBSTEP_6+SUBSTEP_7)

SUBSTEP 9) Compensate output of SUBSTEP_6 (SUBSTEP_6+0.05 in X, −0.025 in Y)

SUBSTEP 10) Compensate output of SUBSTEP_7 (SUBSTEP_7−0.025 in X, +0.05 in Y)

SUBSTEP 11) Combine all shapes to be removed (SUBSTEP_3+SUBSTEP_8)

SUBSTEP 12) Remove Shapes from Incoming Data (Orig Data−SUBSTEP_11)

SUBSTEP 13) Add Compensated 0.5×1.0 Shapes Together (SUBSTEP_4+SUBSTEP_5)

SUBSTEP 14) Add Compensated 0.55×1.2 Shapes Together (SUBSTEP_9+SUBSTEP_10)

SUBSTEP 15) Add All Compensated Shapes Together (SUBSTEP_13+SUBSTEP_14)

SUBSTEP 16) Add Shapes back into data (SUBSTEP_12+SUBSTEP_15).

The substeps 1–16 are executed at an improved speed. Substeps 1–16 involve only one subtraction, and the non-rectangle data is manipulated only in Step 12 and Substep 16.

The foregoing also reduces the intermediate MEBES data file size in that files which are shape-selected tend to be smaller, thereby reducing processing time. The CATS system can execute the steps in less time when smaller files are involved, reducing processing time into minutes or seconds rather than what could be hours if steps 1–4 were executed without first compiling the above efficiently compiled substeps. The files of selected rectangles are always smaller, and as long as they are maintained as files of selected shapes, the CATS system can execute processing very quickly on these shapes. It is, of course, evident from steps 1–16 that the dependency must be preserved.

The result of substep 16 becomes the input for step 2. Step 2 was defined previously as

[STEP_1+0.1]+[AD+0.075]+[ADY+0.075].

The mathematical step 2 cannot be executed by a single execution step. A gathering step is subsequently performed which utilizes the layer number information received from 13 of FIG. 1. The data layer has two parts, the layer number and the layer type. The syntax used in the CATS system for writing this utilizes a semicolon. Layer AD therefore can be written 4;0. If two layers, such AD and ADY share a common characteristic, either layer or layer type, and they share a positive compensation value, they can be gathered together. A table illustrating the rules for gathering follows:

TABLE 5

| First Layer | Second Layer | First Layer Comp | Second Layer Comp | "Gatherable"? |
|---|---|---|---|---|
| 4;0 | 4;1 | 0 | 0 | Yes-Same Layer Number, Written as 4;0.1 |
| 4;0 | 4;1 | 0.025 | 0.025 | Yes-Same Layer Number, Written as 4;0.1 |
| 5;1 | 4;1 | 0.05 | 0.05 | Yes-Same Layer Type, Written as 4,5;1 |
| 5;0 | 4;1 | 0 | 0 | No-No Common Level Naming Characteristic |
| 4;0 | 4;1 | 0.025 | 0 | No-Compensations are different |
| 4;0 | 4;1 | −.025 | −.025 | No Compensations are negative |
| 4;0,1 | 5;0 | 0 | 0 | No* |

*4;0,1 and 5;0 cannot be gathered as they would be written as 4,5;0,1. But this doesn't exclude 5;1 (4,5;0,1 expands to 4;0, 4;1, 5;0 and 5;1), and 5;1 cannot be added to the algorithm. Therefore 5;0 with 4;0,1 cannot be gathered.

Since AD and ADY are from the foregoing table 4;0 and 4;1, and have the same compensation of +0.075, they are gathered and written as 4;0.1. This results in step 2 being rewritten as follows: [STEP_1+0.1]+["4;0,1"+0.075].

The foregoing gathered quantity represents a single mathematical step which the CATS system executes as an "or" function, adding two levels together. However, the performance can be further improved by changing the format from 4;0,1 to a flat format, representing the MEBES data format. From a design library internal to the MEBES data processing system, the format is converted in substeps 17 and 18 as follows:

SUBSTEP 17) Convert "4;0,1" from the design library to the flat format

SUBSTEP 18) [SUBSTEP_16 (a.k.a output of STEP_1)+0.1]+[SUBSTEP_17+0.075]

Step 3 can now be performed as the subtraction quantity: STEP 3: STEP_2−[ADE+0.05]. The ADE layer is also changed in format to the flat format before the subtraction takes place as follows:

SUBSTEP 19) Convert "ADE" from the design library to the flat format

SUBSTEP 20) [SUBSTEP_18 (a.k.a. output of STEP_2)]−[SUBSTEP_19+0.05]

Step 4 is then executed from the results of step 3 as follows:

STEP_3+[KERFAB+0.05]+[POSMKS +0.05]+[FRAME+0.05],+PROTECT where KERFAB is 4;2
POSMKS is 5;0
FRAME is 7;0
PROTECT is 51;0

If the values for KERFAB, POSMKS, FRAME and PROTECT are 4;2, 5;0, 7;0 and 51;0 respectively, they may be gathered as well, using the format of table 6. These gathered quantities are then converted to the flat format and processed as substeps 21–24 as follows:

SUBSTEP 21) Convert "4;2" from the design library to the flat format

SUBSTEP 22) Convert "5;7,0" from the design library to the flat format

SUBSTEP 23) SUBSTEP_21+0.05)+(SUBSTEP_22+0.05)

Step 4 is therefore reduced to step 3 plus substep 24 plus substep 23.

SUBSTEP 24) convert 51;0 from design library to flat format.

Step 4 is therefore reduced to Step_3 (a.k.a SUBSTEP_20) plus SUBSTEP-23 plus SUBSTEP_24. Because addition is associative (order doesn't matter), the next function to be performed could be any of the following:

SUBSTEP_23+SUBSTEP_24
SUBSTEP_20+SUBSTEP_23
SUBSTEP_20+SUBSTEP_24

Which of these to do is dependent on which of the given SUBSTEPS will be reached first during the processing. While it cannot be determined exactly, the system keeps a relative estimate of what the elapsed time will be to the completion of any given step. This is calculated based on the estimated elapsed time of a given function, and the elapsed times of the inputs to the given step.

The following is the table of relative difficulties (hence relative elapsed times) of processing for a number of possible functions that could be performed.

table_build

| Step Type | Value: | |
|---|---|---|
| Flatten design library | 4 | |
| Positive Sizing | 1 | |
| Negative Sizing | 2 | |
| Function OR | 2 | |
| Function OR with + Sizing | 3 | |
| Function OR with − Sizing | 4 | |
| Function MINUS | 4 | |
| Function MINUS with any Sizing | 5 | |
| Function XOR | 2 | |
| Function XOR with any Sizing | 3 | |
| Function AND | 5 | |
| Function AND with any Sizing | 6 | |
| Shape Selection | 4 | +1 per Additional Criteria Possible Criteria Include: Width, Height, Area, Rectangular/Non-Rectangular, Perimeter Maximum of Height/Width, Minimum of Height/Width, Ratio of Height to Width, Ratio of Min of Height to Width, Ratio of Area to Perimeter |
| Outer Serif Generation with offset | 4 10 | |
| Inner Serif Generation with offset | 6 12 | |
| Reverse Tone | 8 | |
| Magnification | 3 | |
| Orientation | 5 | |
| Magnification & Orientation | 7 | |

Based on the table, the difficulties of each SUBSTEP are calculated as the Include File for a given step is generated.

Each of SUBSTEPs 21, 22 and 24 are simply converting from the design library to the flat format. These all have a relative estimate of elapsed time of 4. SUBSTEP 23 is dependent on SUBSTEPs 21 and 22. Therefore, SUBSTEP 23 will have a relative elapsed time of 3 (the value of a function OR with positive sizings on the inputs) plus the larger of SUBSTEP 21 or 22. The estimates for SUBSTEP 21 and 22 are identical (both are 4), so the estimated elapsed time for the completion of SUBSTEP 23 is 7.

Similar calculations are performed throughout for each SUBSTEP, continually adding the relative time estimate of the function performed in a given substep to the largest relative elapsed time of the inputs for that substep. The following is a complete table listing the dependencies of each step and the relative estimated elapsed times to the completion of the given SUBSTEP.

| Sub Step | Dependencies | Relative estimate of Elapsed Time |
|---|---|---|
| 1 | | 6 |
| 2 | | 6 |
| 3 | 1,2 | 8 |
| 4 | 1 | 8 |
| 5 | 2 | 8 |
| 6 | | 6 |
| 7 | | 6 |
| 8 | 6,7 | 8 |
| 9 | 6 | 8 |
| 10 | 7 | 8 |
| 11 | 3,8 | 10 |
| 12 | 11 | 14 |
| 13 | 4,5 | 10 |
| 14 | 9,10 | 10 |
| 15 | 13,14 | 12 |
| 16 | 12,15 | 16 |
| 17 | | 4 |
| 18 | 16,17 | 19 |
| 19 | | 4 |
| 20 | 18,19 | 24 |
| 21 | | 4 |
| 22 | | 4 |
| 23 | 21,22 | 7 |
| 24 | | 4 |
| 25 | 23,24 | 9 |
| 26 | 20,25 | 26 |
| 27 | 26 | 27 |
| 28 | 27 | 34 |

To be efficient, the next calculation should use the two inputs that have the lowest elapsed time to get to that step (to avoid waiting for a step to complete). With possible choices of SUBSTEP_20, SUBSTEP_23, and SUBSTEP_24, the system chooses SUBSTEP_23 and SUBSTEP_24 as the two inputs to use first, as their values are 7 and 4, respectively. (The elapsed time to SUBSTEP_20 is much higher: 24). So we have SUBSTEP_25:

SUBSTEP 25) SUBSTEP_23+SUBSTEP_24.

This process of determining order by elapsed time is not necessary for the next substep, because we now have only two remaining inputs; SUBSTEP 20 and SUBSTEP 25:

SUBSTEP 26) SUBSTEP_20 (a.k.a. STEP_3)+ SUBSTEP_25.

SUBSTEP 26 represents the output of the algorithm which defines all the polygons for the mask. However, the algorithm must be further compensated with the quantities derived from the mask compensation and mask build location, as set forth in table 3. This results in an additional substep as follows: SUBSTEP_27) SUBSTEP_26+0.05.

The compensated algorithm output is then magnified to match the wafer stepper tool magnification. Item 21 of FIG.

1 is part of the build information. This magnification, which in the case of a Nikon 8 stepper tool is known in the industry as 5. The magnification of 5 is multiplied by the technology scale of 0.9 (input in the build information (21)) to get the final magnification of 4.5. Thus, substep 28 is used to represent the output of the algorithm compensated for by the magnification as follows: SUBSTEP_28) SUBSTEP_27: MAG(4.5) ORIENT(270).

The substeps 1–28 and the required dependency tree are compiled into the CATS MEBES command files 24. During execution by the processing step 30 of the CATS system, by observing the foregoing conventions the MEBES data 31 is produced more efficiently and in less time.

The foregoing description applies only to the Kerf structure on the photomask. A similar process is entered into by the system when processing the actual functional product chip. In terms of execution, as will be evident from the following, there is even more parallel activity which may be processed on a parallel basis, thus more efficiently executing the CATS MEBES command files for the product chip.

Referring to the table below which identifies each of the layers in the algorithm defining the product chip, the isometric corrections for the various algorithm shapes, layers AB and AC, an example of the processing of the layer AB is shown as follows:
SUBSTEP1) Select Horizontally Oriented 0.5×1.0 Shapes (long in horizontal direction)
SUBSTEP 2) Select Vertically Oriented 0.5×1.0 Shapes
SUBSTEP 3) Combine Selected Shapes (SUBSTEP_1+ SUBSTEP_2)
SUBSTEP 4) Compensate output of SUBSTEP_1 (SUBSTEP_1+0.025 in X, −0.025 in Y)
SUBSTEP 5) Compensate output of SUBSTEP_2 (SUBSTEP_2=0.025 in X,+0.025 in Y)
SUBSTEP 6) Select Horizontally Oriented 0.55×1.2 Shapes (long in horizontal direction)
SUBSTEP 7) Select Vertically Oriented 0.55×1.2 Shapes
SUBSTEP 8) Combine Selected Shapes (SUBSTEP_6+ SUBSTEP_7)
SUBSTEP 9) Compensate output of SUBSTEP_6 (SUBSTEP_6+0.05 in X, −0.025 in Y)
SUBSTEP 10) Compensate output of SUBSTEP_7 (SUBSTEP_7−0.025 in X, +0.05 in Y)
SUBSTEP 11) Combine all shapes to be removed (SUBSTEP_3+SUBSTEP_8)
SUBSTEP 12) Remove Shapes from Incoming Data (Orig Data−SUBSTEP_11)
SUBSTEP 13) Add Compensated 0.5×1.0 Shapes Together (SUBSTEP_4+SUBSTEP_5)
SUBSTEP 14) Add Compensated 0.55×1.2 Shapes Together (SUBSTEP_9+SUBSTEP_10)
SUBSTEP 15) Add All Compensated Shapes Together (SUBSTEP_13+SUBSTEP_14)
SUBSTEP 16) Add Shapes back into data (SUBSTEP_12+ SUBSTEP_15).

Substeps 17–32 deal with layer AC. The algorithm for the chip is, again referring to table 1, as follows:
SUBSTEP 17) Select Horizontally Oriented 0.4×0.9 Shapes (long in horizontal direction)
SUBSTEP 18) Select Vertically Oriented 0.4×0.9 Shapes
SUBSTEP 19) Combine Selected Shapes (SUBSTEP_17+ SUBSTEP_18)

The optional arguments to the keyword <AC> means that a special compensation has to be applied in addition to the compensation that is applied on request from the customer. This is mainly accounting for non-linearity in the mask etch process, in this case, because a shape of 0.4 width at 1X would unnaturally shorten (so we make it longer by 0.025). Note that the shape is being lengthened by 0.05, which is the 0.025 in the table above combined with the 0.025 in the long direction specified in the keyword table at the top of this example. The "u" in the keyword means the comp is listed as unscaled. The user has the option of specifying which way the comps are to be entered. If any comps are entered as scaled, they are divided by the scale (0.9 in this example) to determine the unscaled comp, since the scale is added in the last substep.
SUBSTEP 20) Compensate output of SUBSTEP_17 (SUBSTEP_17+0.05 in X,−0.025 in Y)
SUBSTEP 21) Compensate output of SUBSTEP_18 (SUBSTEP_18−0.025 in X,+0.05 in Y)
SUBSTEP 22) Select Horizontally Oriented 0.55×1.2 Shapes (long in horizontal direction)
SUBSTEP 23) Select Vertically Oriented 0.55×1.2 Shapes
SUBSTEP 24) Combine Selected Shapes (SUBSTEP_22+ SUBSTEP_23)
SUBSTEP 25) Compensate output of SUBSTEP_22 (SUBSTEP_22+0.05 in X,−0.025 in Y)
SUBSTEP 26) Compensate output of SUBSTEP_23 (SUBSTEP_23−0.025 in X,+0.05 in Y)
SUBSTEP 27) Combine all shapes to be removed (SUBSTEP_19+SUBSTEP_24)
SUBSTEP 28) Remove Shapes from Incoming Data (Orig Data−SUBSTEP_27)
SUBSTEP 29) Add Compensated 0.5×1.0 Shapes Together (SUBSTEP_20+SUBSTEP_21)
SUBSTEP 30) Add Compensated 0.55×1.2 Shapes Together (SUBSTEP_25+SUBSTEP_26)
SUBSTEP 31) Add All Compensated Shapes Together (SUBSTEP_29+SUBSTEP_30)
SUBSTEP 32) Add Shapes back into data (SUBSTEP_31+ SUBSTEP_32)

Substeps 33–39 determine the values in the algorithm of AD (flattened) and ADE (flattened), and apply the mask compensation as well as the magnification compensation as done in the Kerf substeps.
SUBSTEP_33) Convert AD (4;0) from the design library to the flat format
SUBSTEP_34) (SUBSTEP_33+0.075)+(SUBSTEP_16 (a.k.a. STEP_1)+0.1)
SUBSTEP_35) SUBSTEP_34+(SUBSTEP_32−0.05)
SUBSTEP 36) Convert ADE from the design library to the flat format
SUBSTEP 37) SUBSTEP 35—(SUBSTEP 36+0.05)
Mask Compensation:
SUBSTEP 38) SUBSTEP 37+0.05
SUBSTEP 39) MAG (4.5) ORIENT (270)

Thus it can be seen how the creation of the mask detail for the product chip can be effectively determined using the same steps as were available for determining the Kerf structures. The polygons are selected from the common dimension shapes, compensated as a group in the common direction to reduce computation time. A dependency tree is also provided for each of the substeps which define the product chip.

Following execution of all the substeps for all the Kerf and chip products, MEBES datasets are created. The location of these chips on the mask is determined from the same library which created the Kerf. This information builds the job deck and all the data sets from the different segments can be merged into one data set, if desired.

Thus, it is seen how the foregoing method can be used to reduce processing time for generating MEBES data by creating the CATS MEBES command files in accordance with the foregoing process.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for creating CATS Include files comprising:
    creating a table of algorithms which identify a segment of a mask, each layer of a mask set and an algorithm which defines the segment and layer combination appearing on said mask;
    creating a keyword table which defines for each piece of an algorithm, and a given layer and segment combination, a special function which defines polygons to create said segments on the mask;
    creating compensations for dimensions of said polygons for each of said pieces of said algorithm;
    defining mathematical steps from said algorithms and a respective compensation for each segment to be created by said mask; and
    creating a file of commands from said mathematical steps.

2. The method according to claim 1 further comprising: creating a plurality of computationally efficient substeps from said steps, and creating a table of dependencies identifying which of said substeps depend on a previous substep computation.

3. The method according to claim 2 wherein said mathematical substeps which define a relationship having a common layer or layer type, and have substantially the same positive compensation value, are gathered and replaced by an abbreviated layer number and said compensation value which is executed as a single step.

4. The method according to claim 3 further comprising the substep of flattening abbreviated layer numbers by replacing said layer numbers with a flattened design value contained in a library of said abbreviated layer numbers.

5. The method according to claim 2 further comprising adding to each substep which comprises said file of commands a mask compensation factor which compensates for dimensional changes produced by a process which uses said mask.

6. The method according to claim 5 further comprising adding to each substep a magnification factor which matches a magnification by a wafer stepper tool and a technology scale which is used with said mask.

7. The method for creating command files according to claim 2 wherein said substeps are grouped in an order which provides compensations to all polygons of the same shape.

8. The method for creating command files according to claim 7 wherein said substeps are grouped in an order which provides compensations to the same dimension of all the same polygons, and then provides compensations to the remaining dimensions of said polygons.

9. The method for creating CATS MEBES command files according to claim 2 wherein said substeps comprise:
    combining all horizontally oriented polygons with all vertically oriented polygons of the same size;
    compensating a first dimension of said combined polygons, and then a second dimension of said combined polygons; and
    subtracting said combined polygons from said compensated polygons.

10. The method accord to claim 9 further comprising:
    combining all horizontally oriented polygons with all vertically oriented polygons, of a first shape;
    compensating a first dimension of said combined polygons of a first shape, and then a second dimension of said combined polygons of said first shape;
    combining all horizontally oriented polygons of a second shape with all vertically oriented polygons of said second shape;
    compensating said combined horizontally oriented polygons of a second shape and vertically oriented polygons of a second shape in first and second dimensions;
    combining said compensated polygons of said first shape with said compensated polygons of said second shape; and
    subtracting the combination of said polygons of said first shape with said polygons of a second shape from the combination of said compensated combination of said polygons of said first shape and said second shape.

11. The method according to claim 2 wherein said table of dependencies includes an indication of the relative computational efficiency for processing each of said substeps.

12. The method according to claim 11 further comprising ordering said substeps for execution in accordance with the relative computational efficiency of said substeps.

* * * * *